United States Patent [19]

Saito et al.

[11] Patent Number: 5,200,709
[45] Date of Patent: Apr. 6, 1993

[54] AUDIO AMPLIFYING CIRCUIT

[75] Inventors: Masataka Saito, Hirakata; I. Fusanori, Ikoma, both of Japan

[73] Assignee: Matsushita Electric Industrial Co., Ltd., Osaka, Japan

[21] Appl. No.: 755,801

[22] Filed: Sep. 6, 1991

[30] Foreign Application Priority Data

Sep. 19, 1990 [JP] Japan .................................. 2-250644

[51] Int. Cl.$^5$ .............................................. H03F 3/68
[52] U.S. Cl. ...................................... 330/126; 381/28
[58] Field of Search ................... 330/124 R, 126, 295, 330/302, 306; 381/28, 120

[56] References Cited

U.S. PATENT DOCUMENTS

| | | | |
|---|---|---|---|
| 4,052,560 | 10/1977 | Santmann | 333/19 |
| 4,249,042 | 2/1981 | Orban | 330/86 X |
| 4,327,331 | 4/1982 | Yoshimi et al. | 330/126 |
| 4,438,414 | 3/1984 | Blachot | 330/126 X |

FOREIGN PATENT DOCUMENTS

| | | |
|---|---|---|
| 0073885 | 3/1983 | European Pat. Off. |
| 3446660 | 6/1986 | Fed. Rep. of Germany |
| 2440646 | 5/1980 | France |
| 0163710 | 7/1986 | Japan ............................ 381/28 |

Primary Examiner—Steven Mottola
Attorney, Agent, or Firm—Stevens, Davis, Miller & Mosher

[57] ABSTRACT

An amplifying circuit of the invention comprises: a high frequency amplifying circuit for amplifying high frequency; a low frequency amplifying circuit for amplifying a low frequency; input filters which are provided on the input side of the respective amplifying circuits so as to pass the frequency components thereof; output filters having the same characteristics as those of the input filters; and an adding circuit for adding outputs of the output filters. Therefore, an output dynamic range of the whole amplifying circuit is equal to the sum of the dynamic ranges of the respective amplifying circuits, so that a large output which is not distorted even if a sound volume is raised is derived. By providing a matching filter on the input side of the low frequency amplifying circuit, even if the low frequency side output filter which needs a large coil is omitted, the frequency characteristics of the output of the adding circuit can be made flat and the amplifying circuit of a small size and a less distortion can be realized.

12 Claims, 7 Drawing Sheets

AUDIO AMPLIFYING CIRCUIT

BACKGROUND OF THE INVENTION

The invention relates to an amplifying circuit for amplifying an audio reproduction signal or the like including frequency components in a range from a low frequency to a high frequency.

In recent years, the size and weight of portable audio devices have been more and more reduced, and the realization of a high fidelity (Hi-Fi) audio apparatus is required together with the realization of a small size and a small electric power consumption from a battery.

To meet the above requirements, for instance, a conventional amplifying circuit is constructed as shown in FIG. 1.

In the diagram, when a reproduction signal is supplied from an input terminal 22, the reproduction signal is amplified having an amplifying circuit 21 by an amplification gain which is determined by gain setting resistors 24 and 25. After that, the amplified signal is generated from an output terminal 23 through a coupling capacitor 26 and a resistor 27. In such a conventional amplifying circuit 21, as shown in FIG. 2A, an input signal M of the amplifying circuit 21 is amplified within a range of an output dynamic range D as shown in FIG. 2A.

However, such a conventional amplifying circuit has a problem such that in the case of amplifying a signal of, particularly, a music source having frequency components in a range from a low frequency to a high frequency, as shown in FIGS. 2A and 2B, despite the fact that a power source voltage d exists, the amplifying circuit has only an output dynamic range D from which a circuit using region C has been subtracted. As a result, when a sound volume is raised, as shown in FIG. 2B, a high amplitude portion of the amplified signal reaches the upper or lower limit of the output dynamic range D and is distorted.

SUMMARY OF THE INVENTION

In consideration of the above conventional problems, it is an object of the invention to provide an amplifying circuit which has a dynamic range larger than an output dynamic range of the circuit that is decided by a power source voltage and in which no distortion occurs in the high amplitude portion of the amplified signal.

To solve the above problems, an amplifying circuit of the invention comprises: a high frequency amplifying circuit to amplify a high frequency component of a reproduction signal having frequency components in a range from a low frequency to a high frequency; a low frequency amplifying circuit to amplify a low frequency component of the reproduction signal; an input filter provided on the input side of each of the amplifying circuits so as to pass the frequency component of each amplifying circuit; an output filter which is provided on the output side of each of the amplifying circuits and has the same characteristics as those of the input filter; and an adding circuit to add outputs of the output filters, wherein the amplified reproduction signal, including the frequency components in a range from a low frequency to high frequency which have been added by the adding circuit, is directly added to an electro-acoustic converter.

On the other hand, an amplifying circuit of the invention comprises: a high frequency amplifying circuit to amplify a high frequency component of a reproduction signal having frequency components in a range from a low frequency to a high frequency; a low frequency amplifying circuit to amplify a low frequency component of the reproduction signal; an input filter arranged on the input side of each of the amplifying circuits so as to pass the frequency component of each amplifying circuit; an output filter on the high frequency side which is provided on the output side of the high frequency amplifying circuit and has the same characteristics of those of the high frequency input filter; a matching filter provided in a low frequency amplifying circuit system as a filter to match with the filter of a high frequency amplifying circuit system; and an adding circuit to add outputs of the amplifying circuit systems, wherein the amplified reproduction signal including the frequency components in a range from a low frequency to a high frequency which have been added by the adding circuit is generated.

The high frequency band and the low frequency band are respectively independently amplified by the high frequency amplifying circuit or the low frequency amplifying circuit in a range of the dynamic range of each amplifying circuit and the amplified outputs are added by the adding circuit without using the mutual amplifying circuits as loads. Thus, a large output in a large output dynamic range to which the dynamic range of each amplifying circuit has been added is derived without distortion.

In the case of omitting the output filter of the low frequency amplifying circuit, the low frequency amplifying circuit serves as a load when it is seen from the high frequency amplifying circuit side, so that the output level of the high frequency band decreases. However, since the high frequency amplifying circuit does not become a load when it is seen from the low frequency amplifying circuit side, a circuit having a large dynamic range in only a low frequency band can be constructed.

However, since the frequency characteristics are not flat, a matching filter needs to be inserted into the input stage.

DESCRIPTION OF THE PREFERRED EMBODIMENTS

Figure 1:
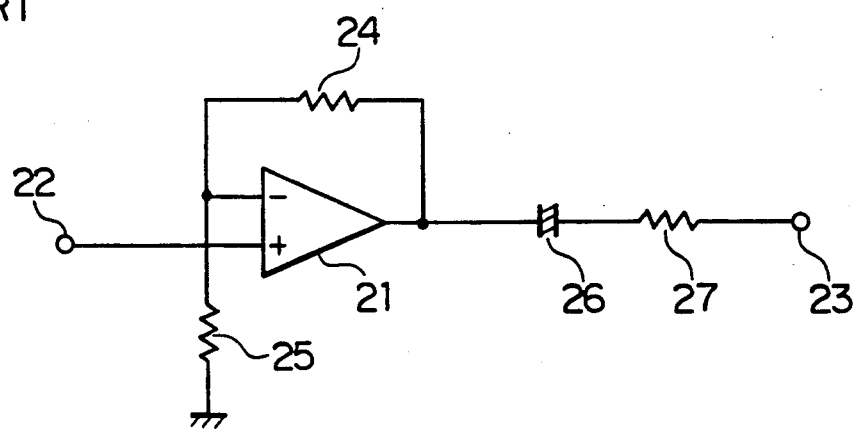
FIG. 1 is a circuit diagram of a conventional amplifying circuit.
Figure 2A:
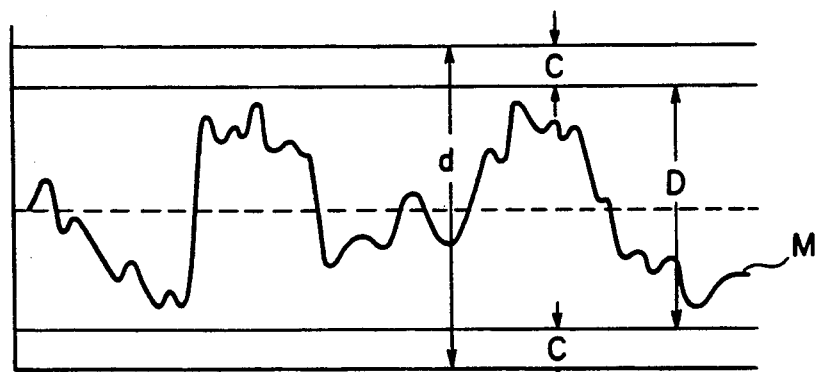
FIGS. 2A and 2B are waveform diagrams of the circuit of FIG. 1.
Figure 2B:
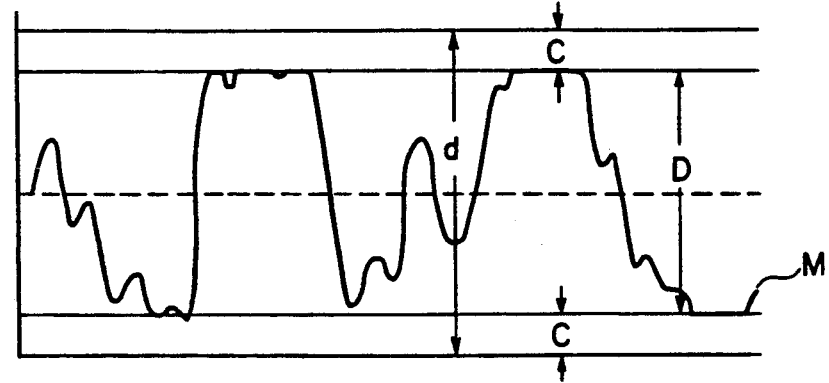
Figure 3:
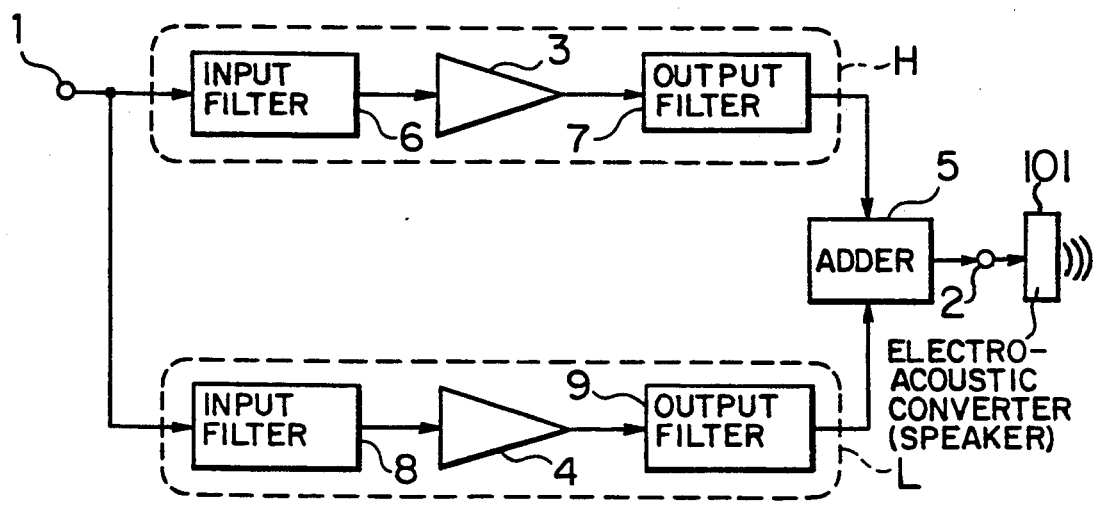
FIG. 3 is a block diagram of an amplifying circuit of the first embodiment of the invention.

FIG. 3 is a block diagram of the first embodiment of the invention.

In the diagram, when a reproduction signal of an audio reproducing apparatus or the like is supplied from an input terminal 1, a high frequency component in the reproduction signal is amplified by a high frequency amplifying circuit system H and a low frequency component is amplified by a low frequency amplifying circuit system L. The high frequency amplifying circuit system H comprises: a high frequency side input filter 6 to pass only the high frequency component; a high frequency amplifying circuit 3 provided at the post stage of the high frequency side input filter 6; and a high frequency side output filter 7 which is provided at the post stage of the high frequency amplifying circuit 3 and has the same characteristics as those of the high frequency side input filter 6. On the other hand, the low frequency amplifying circuit system L comprises: a low frequency side input filter 8 to pass only the low frequency component; a low frequency amplifying circuit 4 provided at the post stage of the low frequency side input filter 8; and a low frequency side output filter 9 which is provided at the post stage of the low frequency amplifying circuit 4 and has the same characteristics as those of the low frequency side input filter 8. An output of the high frequency amplifying circuit system H and an output of the low frequency amplifying circuit system L are connected to an adding circuit 5. Those two outputs are added by the adding circuit 5 and an output of the adding circuit 5 is generated from an output terminal 2.

A function of the filter used in each of the amplifying circuit systems will now be described.

Figure 4:
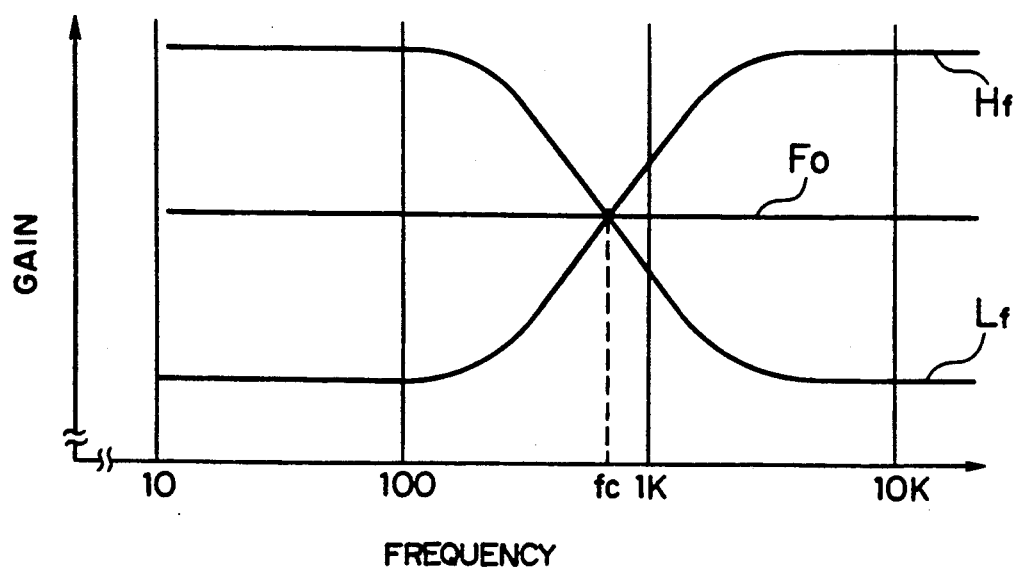
FIG. 4 is a frequency characteristic diagram of the circuit of FIG. 3.

First, the high frequency side input filter 6 and the low frequency side input filter 8 produce frequency characteristics of $H_f$ and $L_f$ in FIG. 4. The high frequency side output filter 7 and low frequency side output filter 9 are provided to prevent the outputs of the high frequency amplifying circuit 3 and the low frequency amplifying circuit 4 from being largely attenuated because one of the amplifying circuits becomes a load for the other one when the outputs of the amplifying circuits 3 and 4 are added by the adding circuit 5. That is, the high frequency side output filter 7 functions so that the high frequency amplifying circuit 3 does not become a load of the output of the low frequency amplifying circuit 4. The low frequency side output filter 9 functions so that the low frequency amplifying circuit 4 does not become a load of the high frequency amplifying circuit 3. The frequency characteristics of the output signal of the adding circuit 5 which is supplied to the output terminal 2 become flat as shown by frequency characteristics $F_O$ in FIG. 4.

Figure 5A:
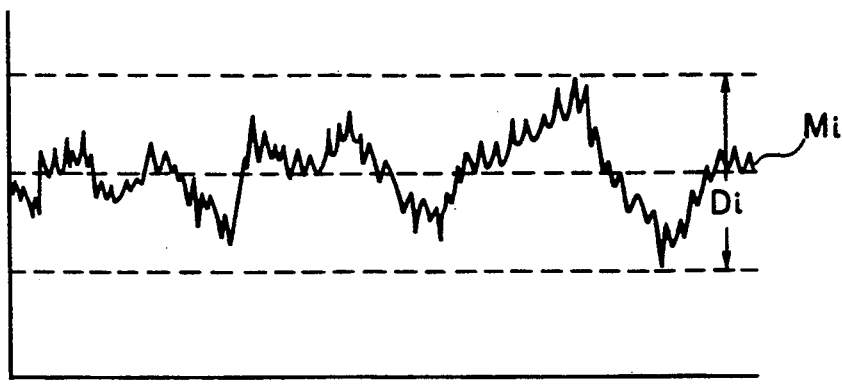
FIGS. 5A, 5B, 5C and 5D are waveform diagrams at respective points in FIG. 4.
Figure 5B:
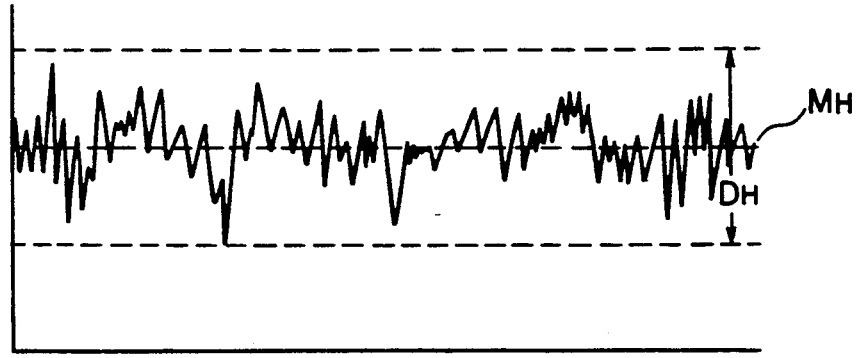
Figure 5C:
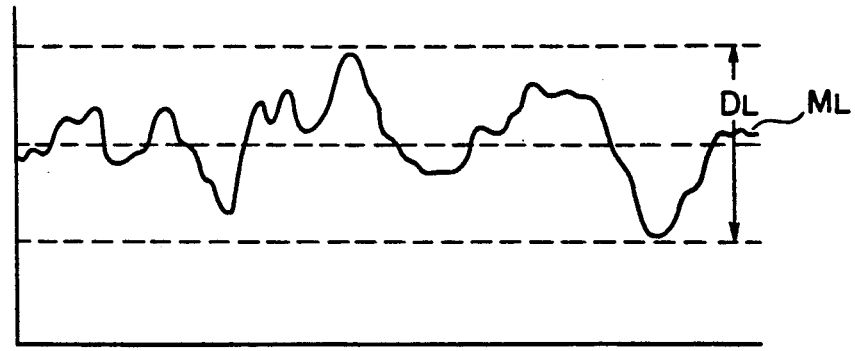
Figure 5D:
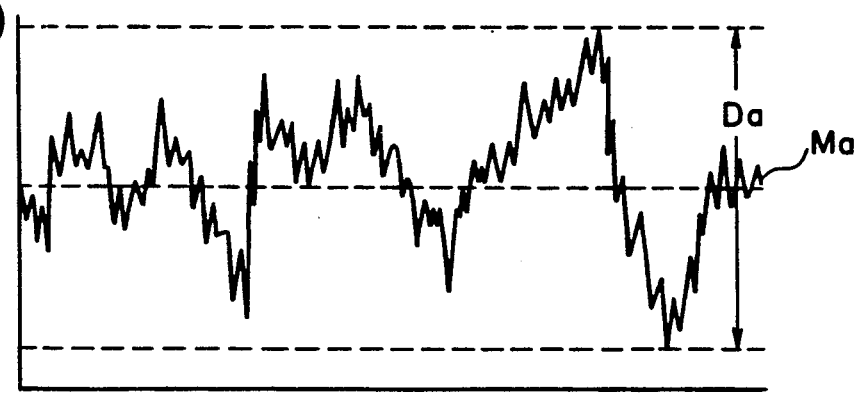

In the above construction, now assuming that a reproduction signal $M_i$ including frequency components from a high frequency to a low frequency within a range of a dynamic range $D_i$ of the circuit as shown in FIG. 5A has been supplied to the input terminal 1, the amplifying circuits 3 and 4 of the amplifying circuit systems H and L can amplify a high frequency band signal $M_H$ and a low frequency band signal $M_L$ as shown in FIGS. 5B and 5C until dynamic ranges $D_H$ and $D_L$ of the operating voltages of the amplifying circuits 3 and 4 on the basis of the frequency characteristics shown in FIG. 4 mentioned above, respectively. After the signals were amplified, by adding the amplified signals by the adding circuit 5, an output signal $M_a$ can obtain a large amplitude in a range of an output dynamic range $D_a$ of the sum of the dynamic ranges of both of the amplifying circuits as shown in FIG. 5D. Since the high amplitude portion does not reach the upper limit or the lower limit of the dynamic range $D_a$, the output signal is not distorted. A load such as a speaker or the like can be driven by such an output signal.

Figure 6:
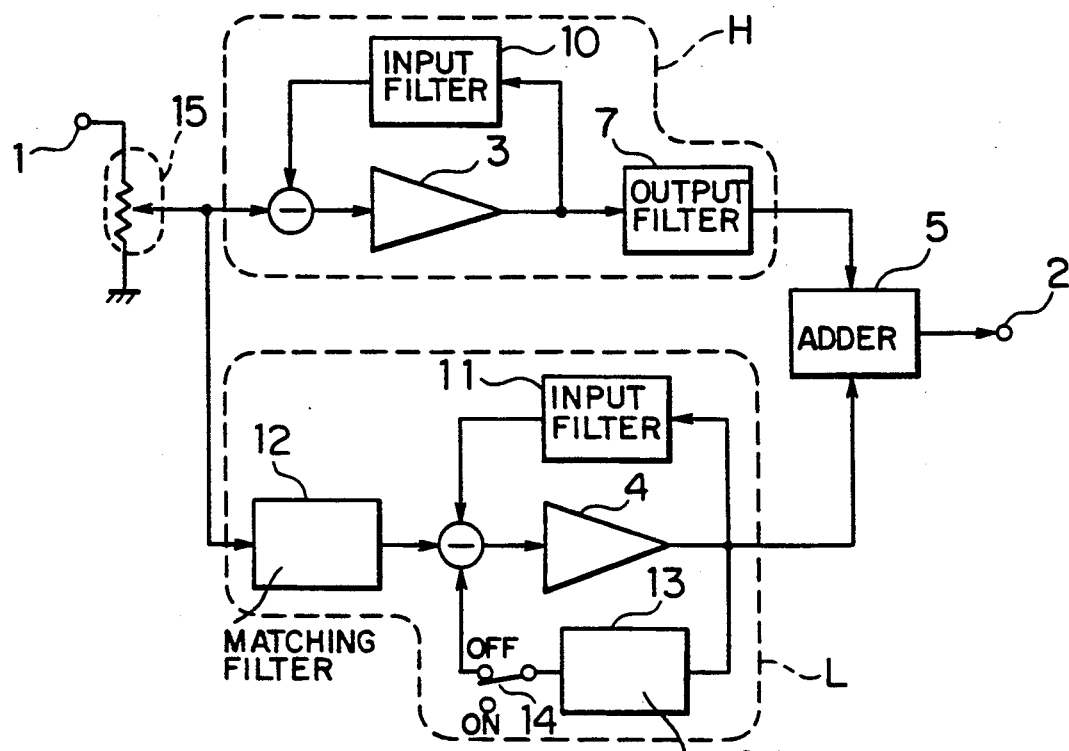
FIG. 6 is a block diagram of an amplifying circuit according to the second embodiment.

FIG. 6 shows the second embodiment of the invention.

In FIG. 6, each of the high frequency amplifying circuit system H and the low frequency amplifying circuit system L shown in FIG. 4 is constructed by a negative feedback amplifying circuit. In the high frequency amplifying circuit system H, a negative feedback circuit, which determines a gain of the high frequency amplifying circuit 3, and a high frequency side input filter 10 are commonly used. On the other hand, in the low frequency amplifying circuit system L, a negative feedback circuit, which decides a gain of the low frequency amplifying circuit 4, and a low frequency side input filter 11 are commonly used. In the low frequency amplifying circuit system L, the low frequency side output filter 9 is omitted, and a matching filter 12 is provided on the input side of the low frequency amplifying circuit 4. Also, a low frequency emphasizing filter 13 and a change-over switch 14 are arranged in parallel with the low frequency side input filter 11. A volume 15 is arranged among the input terminal 1, the high frequency amplifying circuit system H, and the low frequency amplifying circuit system L. Outputs of both of the amplifying circuit systems H and L are added by the adding circuit 5 and an output signal of the adding circuit 5 is generated from the output terminal 2.

The functions of the low frequency emphasizing filter 13 and the matching filter 12 of the above-discussed construction will now be described.

Figure 7:
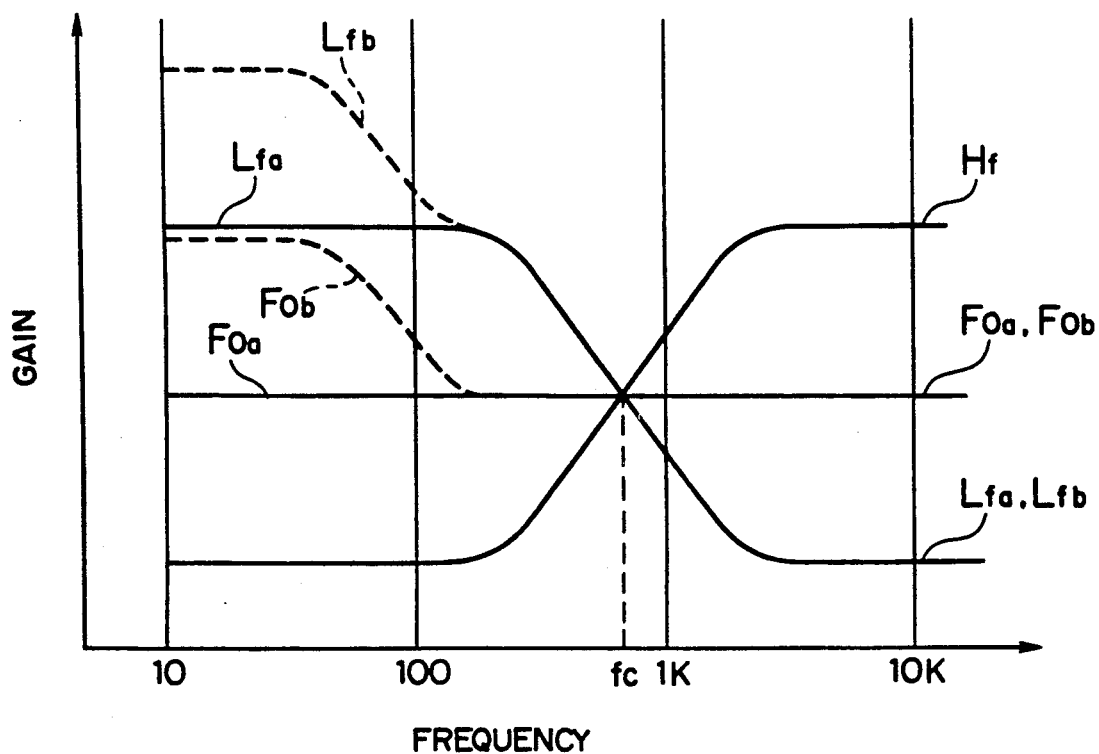
FIG. 7 is a frequency characteristic diagram of the circuit of FIG. 6.

When the change-over switch 14 is turned on, the low frequency component which has passed through the matching filter 12 is emphasized by the low frequency emphasizing filter 13. Frequency characteristics $L_{fa}$ of the low frequency amplifying circuit system L shown in FIG. 7 are changed to frequency characteristics $L_{fb}$. In the frequency characteristics of the amplifying circuit as a whole, therefore, the frequency characteristics of the high frequency amplifying circuit system H are held to $H_f$ and do not change, so that the frequency characteristics are changed from $F_{Oa}$ to $F_{Ob}$ and the low frequency is emphasized.

The matching filter 12 will now be described.

Figure 8A:
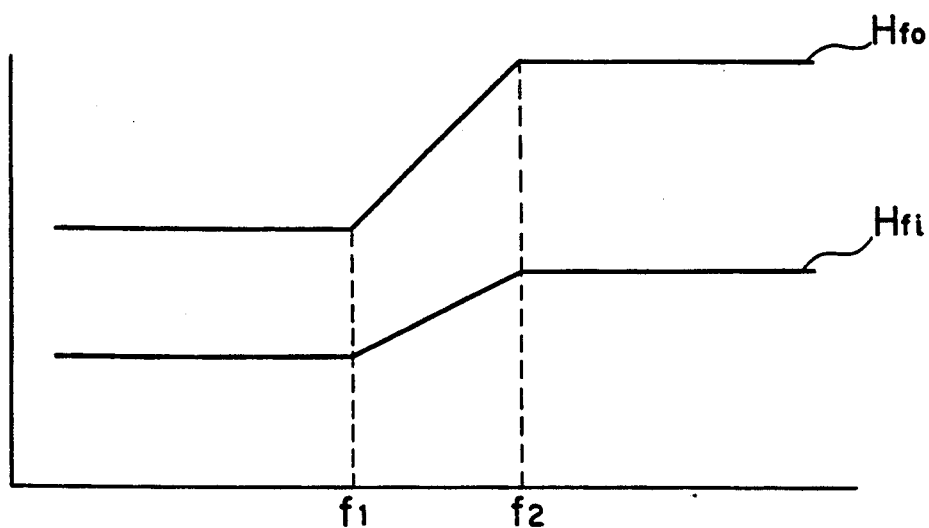
FIGS. 8A and 8B are explanatory diagrams of the frequency characteristics of FIG. 7.

FIG. 8A shows characteristics $H_{fi}$ on the output side by the high frequency side input filter 10 of the high frequency amplifying circuit system H and characteristics $H_{fo}$ on the output side by the high frequency side output filter 7. A slope of a level change between frequencies $f_1$ to $f_2$ in the case of the characteristics $H_{fo}$ is larger than that in the case of the characteristics $H_{fi}$.

Figure 8B:
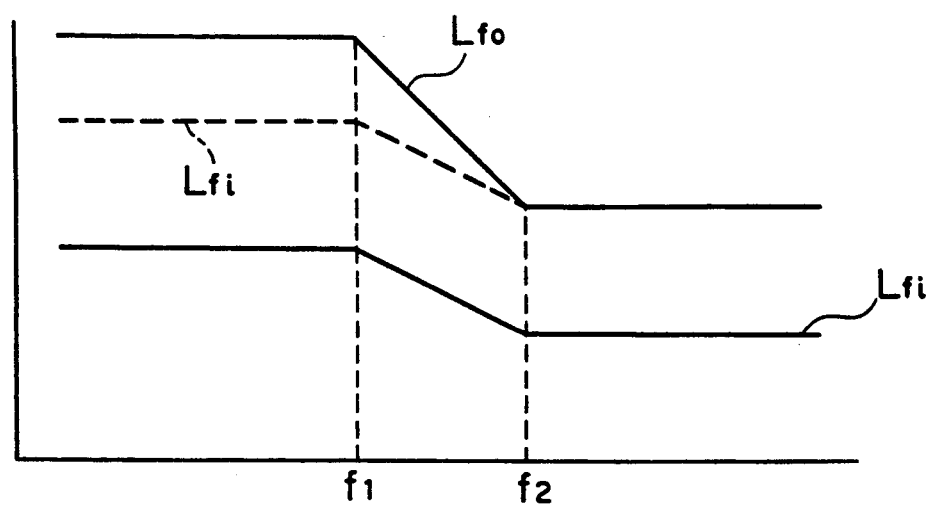

FIG. 8B shows characteristics $L_{fi}$ on the output side by the low frequency side input filter 11 of the low frequency amplifying circuit system L and characteristics $L_{fi}'$ on the input side of the adding circuit 5. Since the low frequency side output filter does not exist, if the matching filter 12 is not used, slopes of the level changes between the frequencies $f_1$ to $f_2$ for the characteristics $L_{fi}$ and $L_{fi}'$ are equal. However, when an output of the high frequency amplifying circuit system H having the characteristics $H_{fi}$ and $H_{fo}$ and an output of the low frequency amplifying circuit system L having the characteristics $L_{fl}$ and $L_{fl}'$ are added by the adding circuit 5, the frequency characteristics of the output signal of the adding circuit 5 are not flat since the level of the high frequency is high. By inserting the matching filter 12, therefore, the characteristics $L_{fl}'$ shown in FIG. 8B are changed to $L_{fo}$. When the output of the high frequency amplifying circuit system H and the output of the low frequency amplifying circuit system L are added by the adding circuit 5, an output having flat characteristics such as $F_{Oa}$ shown in FIG. 7 is obtained.

Since the low frequency side output filter has been omitted in the second embodiment, the high frequency side output filter 7 functions so that the high frequency amplifying circuit 3 does not become a load of the output of the low frequency amplifying circuit 4 in a manner similar to the case mentioned above. However, since the low frequency side output filter does not exist, the low frequency amplifying circuit 4 becomes a load for the high frequency amplifying circuit 3. Thus, although the gain of the high frequency amplifying circuit 3 is dropped, by dropping the amplification gain of the low frequency amplifying circuit 4 by only an amount corresponding to the dropped gain of the high frequency amplifying circuit system H, the flat gain of the output of the adding circuit 5 is realized. Upon emphasis of the low frequency band at the turn-on of the change-over switch 14, the low frequency amplifying circuit 4 generates an output signal amplified by its full gain. In the above case, the gain of only the low frequency band is emphasized as shown by the characteristics $L_{fb}$ in FIG. 5. In the above case, the gain of the low frequency amplifying circuit 4 is set in a manner such that the signal is amplified within a range of the output dynamic range and no distortion occurs even if the low frequency band is emphasized.

Figure 9:
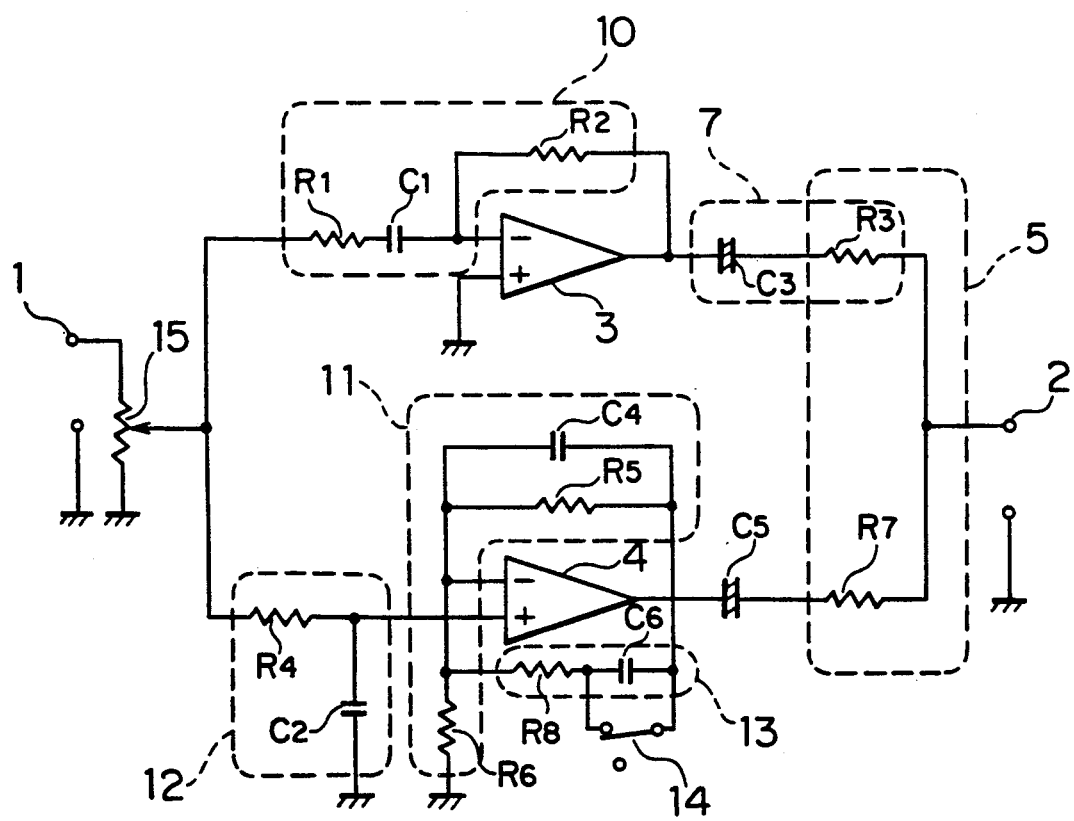
FIG. 9 is a practical circuit diagram of the second embodiment.

FIG. 9 shows an example of a practical circuit in the second embodiment.

In the diagram, the high frequency side input filter 10 which is also commonly used by the feedback circuit is constructed by resistors $R_1$ and $R_2$ and a capacitor $C_1$. The high frequency side output filter 7 is constructed by a resistor $R_3$ and a capacitor $C_3$.

The low frequency side input filter 11, which is also commonly used by the feedback circuit, is constructed by resistors $R_5$ and $R_6$ and a capacitor $C_4$. The matching filter 12 is constructed by a resistor $R_4$ and a capacitor $C_2$. The low frequency emphasizing filter 13 is constructed by a resistor $R_8$ and a capacitor $C_6$. Further, the adding circuit 5 is constructed by resistors $R_3$ and $R_7$. The resistor $R_3$ is also commonly used for the high frequency side output filter 7. A capacitor $C_5$ is a coupling capacitor on the output side of the low frequency amplifying circuit 4.

The operation of the circuit with the above structure is the same as the operation in the second embodiment shown in FIG. 7 and its detailed description is omitted.

According to the practical second embodiment shown in FIG. 9, the circuit can be miniaturized as a whole. That is, in the first embodiment shown in FIG. 3, in the case of constructing the low frequency side output filter 9, a large coil is necessary and the characteristics are distorted by the hysteresis of the coil. However, in the case of adding an output filter on the low frequency side in the structure of FIG. 9, the filter 9 can be constructed by a filter circuit comprising a small capacitor and a resistor, so that the filter circuit can be formed in a small space.

Figure 10:
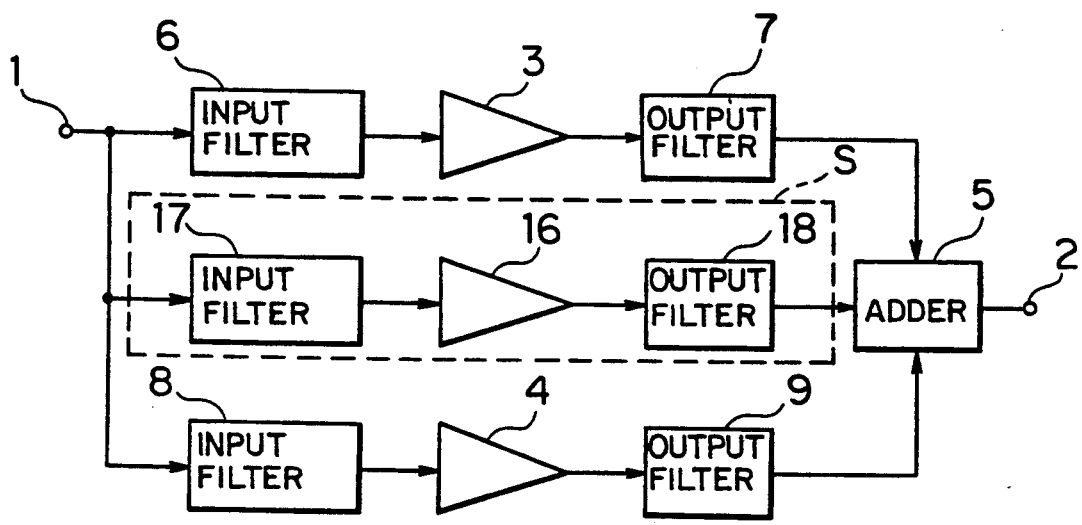
FIG. 10 is a block diagram of an amplifying circuit of the third embodiment.

The third embodiment of the invention shown in FIG. 10 will now be described. In FIG. 10, a middle frequency amplifying circuit system S is connected in parallel with the construction of the first embodiment shown in FIG. 3. That is, the reproduction signal which is supplied from the input terminal 1 is separately amplified with respect to three low, middle, and high frequency components.

In the diagram, the middle frequency amplifying circuit system S comprises a middle frequency input filter 17, a middle frequency amplifying circuit 16, and a middle frequency output filter 18.

Figure 11:
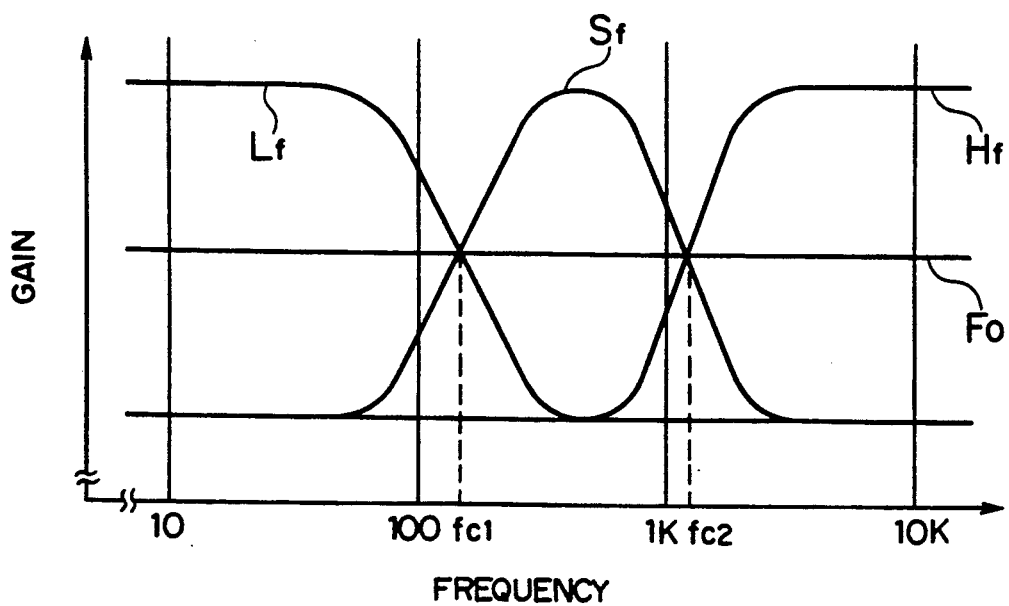
FIG. 11 is a frequency characteristic diagram of the circuit of FIG. 10.

In the above structure, when a reproduction signal is supplied from the input terminal 1, the high frequency component in the reproduction signal is amplified by the high frequency amplifying circuit system H having characteristics $H_f$ in FIG. 11, and the middle frequency component is amplified by the middle frequency amplifying circuit system S having characteristics $S_f$ in FIG. 11. Also the low frequency component is amplified by the low frequency amplifying circuit system L having characteristics $L_f$ in FIG. 11. Outputs of the amplifying circuit systems H, S, and L are added by the adding circuit 5, so that an output signal having flat characteristics as shown by $F_O$ in FIG. 11 is supplied to the output terminal 2. Since the output dynamic range is equal to the sum of the dynamic ranges of the amplifying circuit systems of the high, middle, and low frequencies, the output dynamic range can be remarkably enlarged as compared with the case of the first embodiment shown in FIG. 3.

In the example of FIG. 10, the frequency band of the reproduction signal has been divided into three high, middle, and low frequency bands. However, a similar effect is also obtained even when the frequency band of the reproduction signal is further divided into four or more frequency bands.

As described above, according to the amplifying circuit of the invention, the high frequency component and the low frequency component in the reproduction signal are respectively amplified by the high frequency amplifying circuit and the low frequency amplifying circuit and are added by the adding circuit. Therefore, the output dynamic range of the whole amplifying circuit has a large value corresponding to the sum of the dynamic ranges of the amplifying circuits. A large output is derived without being distorted even for the high amplitude portion of the reproduction signal.

By providing the matching filter for the low frequency amplifying circuit system, even if the low frequency side output filter which needs the coil is omitted, the frequency characteristics of the output of the adding circuit can be made flat and a small-sized amplifying circuit exhibiting less distortion can be provided.

We claim:
1. An amplifying circuit comprising:
   a high frequency amplifying circuit for amplifying a high frequency component of a reproduction signal having frequency components in a range from a low frequency to a high frequency;
   a low frequency amplifying circuit for amplifying a low frequency component of the reproduction signal;
   first and second input filters which are respectively provided on the input sides of said respective amplifying circuits so as to pass the respective high and low frequency components of the amplifying circuits;

first and second output filters which are respectively provided on the output sides of the respective amplifying circuits and which have the same characteristics as those of the respective first and second input filters; and an adding circuit for adding outputs of the output filters, wherein said adding circuit outputs an amplified reproduction signal including the frequency components in a range from the low frequency to the high frequency which have been added by the adding circuit.

2. An amplifying circuit according to claim 1, wherein at least three circuits of amplifying circuit systems are provided.

3. An amplifying circuit according to claim 2, wherein the low frequency side output filter is constructed by connecting a capacitor and a resistor.

4. An amplifying circuit comprising:
a high frequency amplifying circuit for amplifying a high frequency component of a reproduction signal having frequency components in a range from a low frequency to a high frequency;
a low frequency amplifying circuit for amplifying a low frequency component of the reproduction signal;
input filters which are provided on the input side of said amplifying circuits so as to pass the frequency components;
high frequency side output filters which are provided on the output side of the high frequency amplifying circuit and have the same characteristics as those of the high frequency input filters;
a matching filter which is provided in the low frequency amplifying circuit system as a filter to match with the filters of the high frequency amplifying circuit system; and
an adding circuit for adding outputs of said amplifying circuit systems (H, L),
wherein the amplified reproduction signal including the frequency components in a range from the low frequency to the high frequency which have been added by the adding circuit is generated.

5. An amplifying circuit according to claim 4, wherein the matching filter is provided on the input side of the low frequency amplifying circuit.

6. An amplifying circuit according to claim 4, wherein a gain of the low frequency amplifying circuit is set so as to suppress the signal by only an amount of the output which is attenuated upon addition since the output of the high frequency amplifying circuit becomes a load and a filter for emphasizing the low frequency and a change-over switch to switch the operation of said filter are provided for the low frequency amplifying circuit system, thereby emphasizing the low frequency band.

7. An amplifying circuit according to claim 5, wherein a gain of the low frequency amplifying circuit is set so as to suppress the signal by only an amount of the output which is attenuated upon addition since the output of the high frequency amplifying circuit become a load and a filter for emphasizing the low frequency and a change-over switch to switch the operation of said filter are provided for the low frequency amplifying circuit system, thereby emphasizing the low frequency band.

8. An amplifying circuit according to claim 4, wherein the input filters are constructed so as to be also commonly used by feedback circuits of the amplifying circuits and constants of said input filters are set.

9. An amplifying circuit according to claim 5, wherein the input filters are constructed so as to be also commonly used by feedback circuits of the amplifying circuits and constants of said input filters are set.

10. An amplifying circuit according to claim 6, wherein the input filters are constructed so as to be also commonly used by feedback circuits of the amplifying circuits and constants of said input filters are set.

11. An amplifying circuit according to claim 7, wherein the input filters are constructed so as to be also commonly used by feedback circuits of the amplifying circuits and constants of said input filters are set.

12. An amplifying circuit according to claim 1, further comprising an electro-acoustic converter which receives the amplified reproduction signal from said adding circuit.

* * * * *